(12) United States Patent
Jeong et al.

(10) Patent No.: US 10,849,258 B2
(45) Date of Patent: Nov. 24, 2020

(54) ELECTRONIC COMPONENT PACKAGE FOR ELECTROMAGNETIC INTERFERENCE SHIELDING AND METHOD FOR MANUFACTURING THE SAME

(71) Applicant: Ntrium Inc., Suwon (KR)

(72) Inventors: Se Young Jeong, Suwon (KR); Ki Su Joo, Suwon (KR); Ju Young Lee, Suwon (KR); Jeong Woo Hwang, Suwon (KR); Jin Ho Yoon, Suwon (KR)

(73) Assignee: NTRIUM INC., Suwon-si (KR)

( * ) Notice: Subject to any disclaimer, the term of this patent is extended or adjusted under 35 U.S.C. 154(b) by 275 days.

(21) Appl. No.: 15/950,287

(22) Filed: Apr. 11, 2018

(65) Prior Publication Data

US 2018/0235116 A1 Aug. 16, 2018

Related U.S. Application Data

(62) Division of application No. 15/362,872, filed on Nov. 29, 2016, now Pat. No. 9,974,215.

(30) Foreign Application Priority Data

Nov. 9, 2016 (KR) .................. 10-2016-0148894

(51) Int. Cl.
*H05K 9/00* (2006.01)
*H01L 23/552* (2006.01)
(Continued)

(52) U.S. Cl.
CPC ....... *H05K 9/0088* (2013.01); *H01L 23/3135* (2013.01); *H01L 23/552* (2013.01);
(Continued)

(58) Field of Classification Search
USPC ................... 29/841, 829, 825, 592.1
See application file for complete search history.

(56) References Cited

U.S. PATENT DOCUMENTS 6,566,596 B1 5/2003 Askew
9,269,673 B1 2/2016 Lin et al.
(Continued)

FOREIGN PATENT DOCUMENTS

JP 2005-79139 3/2005
JP 2015-43357 3/2015
(Continued)

OTHER PUBLICATIONS

EPO, the extended European search report of EP 16201167.0 dated Apr. 6, 2017.
(Continued)

*Primary Examiner* — Peter Dungba Vo
*Assistant Examiner* — Azm A Parvez
(74) *Attorney, Agent, or Firm* — Lex IP Meister, PLLC

(57) ABSTRACT

Provided is an electronic component package for electromagnetic interference shielding. The electronic component package for electromagnetic interference shielding according to an embodiment of the present invention comprises a substrate where electronic components are mounted, a molding member formed on the substrate and the electronic components, a magnetic layer formed on the molding member, and a conductive layer formed on the magnetic layer. Electromagnetic waves generated from the electronic components embedded in the molding member are absorbed in the magnetic layer to thus prevent or reduce harmful influence on other electronic components mounted in adjacent places. In addition, harmful electromagnetic waves generated from the outside may be shielded due to the conductive layer formed on the magnetic layer, thereby protecting electronic
(Continued)

components embeded in the molding member from being influenced by the electromagnetic waves.

5 Claims, 3 Drawing Sheets

(51) Int. Cl.
*H01L 23/31* (2006.01)
*H05K 1/09* (2006.01)
*H05K 1/18* (2006.01)
*H05K 3/46* (2006.01)

(52) U.S. Cl.
CPC ............ *H05K 1/095* (2013.01); *H05K 1/186* (2013.01); *H05K 3/4644* (2013.01); *H05K 9/0024* (2013.01); *H01L 2924/1203* (2013.01); *H01L 2924/1304* (2013.01); *H01L 2924/1438* (2013.01); *H01L 2924/19041* (2013.01); *H01L 2924/19042* (2013.01); *H01L 2924/19043* (2013.01); *H05K 3/467* (2013.01); *H05K 3/4664* (2013.01); *H05K 2201/0715* (2013.01); *H05K 2201/083* (2013.01); *Y10T 29/49146* (2015.01)

(56) References Cited

U.S. PATENT DOCUMENTS

| 10,287,444 | B2* | 5/2019 | Fang ................. H01L 23/552 |
| 2012/0086110 | A1 | 4/2012 | Masuda |
| 2012/0228749 | A1 | 9/2012 | Pagaila |
| 2013/0207294 | A1 | 8/2013 | Jeon et al. |
| 2013/0214396 | A1 | 8/2013 | Kim |
| 2014/0268625 | A1 | 9/2014 | Sherrer et al. |
| 2015/0052743 | A1 | 2/2015 | Kawabata et al. |
| 2016/0358862 | A1* | 12/2016 | Lee ..................... H01L 23/552 |
| 2017/0278804 | A1 | 9/2017 | Kawabata et al. |

FOREIGN PATENT DOCUMENTS

| JP | 5988003 B1 * | 9/2016 | ....... H01L 23/49805 |
| JP | 5988003 | 9/2017 | |
| KR | 10-2013-0104869 | 9/2013 | |
| TW | 200833187 | 8/2008 | |
| WO | 2015/157987 | 10/2015 | |

OTHER PUBLICATIONS

JPO, the Notification of Reasons for Refusal of JP 2016-237576 dated Nov. 28, 2017.
KIPO, the Office Action of KR 10-2016-0148894 dated Jan. 2, 2018.
TIPO, the Office Action of TW 105138133 dated Dec. 27, 2017.
SIPO, the Office Action of CN 201611038255.2 dated Mar. 15, 2019.
EPO, Office Action of EP 16201167.0 dated Sep. 26, 2019.

* cited by examiner

ELECTRONIC COMPONENT PACKAGE FOR ELECTROMAGNETIC INTERFERENCE SHIELDING AND METHOD FOR MANUFACTURING THE SAME

CROSS-REFERENCES TO RELATED APPLICATION

This application is a Divisional Application of U.S. patent application Ser. No. 15/362,872 filed on Nov. 29, 2016, which claims priority to Korean Patent Application No. 10-2016-0148894 filed on Nov. 9, 2016, the contents of which are incorporated herein by reference.

TECHNICAL FIELD

The present invention relates to an electronic component package for electromagnetic interference shielding, and more particularly, to an electronic component package for electromagnetic interference shielding which is capable of absorbing and reflecting harmful electromagnetic waves by adopting a magnetic layer and a conductive layer.

BACKGROUND OF THE DISCLOSURE

As technology for electronic communication develops recently, many electronic devices, e.g., a personal cellular phone or a tablet personal computer (PC), have been increasingly used and attention has been paid to electromagnetic waves resulting from the electronic devices.

Electromagnetic interference caused by noise resulting from high-density integration of electronic components and high speed in a signal processing speed is regarded as a factor determining an operation and reliability of various automation equipment and control devices.

A method has been widely used until recently for electromagnetic interference shielding, in which a shield layer is formed on a surface of, e.g., electronic components using a material having high electric conductivity and reflects electromagnetic waves to shield the electromagnetic waves.

However, the shielding merely based on the reflection of electromagnetic waves has only limited capability to shield electromagnetic waves generated in a wide range of frequencies. Accordingly, various technologies have been under development to solve such a problem.

Also, when electromagnetic waves generated in electronic components mounted in an electronic component package have an influence on electronic components mounted in an adjacent electronic component package, the shielding based on the reflection by conductive materials is also limited in removing such an influence.

DISCLOSURE

Technical Problems

The present invention provides an electronic component package for electromagnetic interference shielding which is provided with a magnetic layer and a conductive layer to absorb and reflect electromagnetic waves simultaneously, and the method of manufacturing the electronic component package.

Technical Solution

An electronic component package for electromagnetic interference shielding according to an embodiment of the present invention comprises a substrate where electronic components are mounted, a molding member formed on the substrate and the electronic components, a magnetic layer formed on the molding member, and a conductive layer formed on the magnetic layer.

The magnetic layer comprises a first binder resin and magnetic particles and the magnetic particles may be at least one selected from the group consisting of iron, cobalt, nickel, a nickel alloy, stainless steel, ferrite, and a permalloy.

The conductive layer comprises a second binder resin and conductive particles and the conductive particles may be at least one selected from the group consisting of silver, copper, aluminum and an aluminum alloy, and a carbon-based material.

The electronic component package for electromagnetic interference shielding may further include a ground electrode formed at a side of the substrate and configured to be embedded in the substrate, having a surface exposed at a side of the substrate. The conductive layer contacts the ground electrode.

The second binder resin may have a molecular weight of 1,500 to 15,000 g/mol.

A method of manufacturing an electronic component package for electromagnetic interference shielding according to an embodiment of the present invention comprises providing a substrate where electronic components are mounted, forming a molding member on the electronic components and the substrate, forming a magnetic layer on the modeling member, and forming a conductive layer on the magnetic layer.

The magnetic layer comprises a first binder resin and magnetic particles.

The conductive layer comprises a second binder resin and conductive particles.

The magnetic layer and the conductive layer may be formed by at least one selected from the group consisting of sputtering, plating, spraying, and a shielding tape.

The second binder resin may have a molecular weight of 1,500 to 15,000 g/mol.

When the magnetic layer or the conductive layer is formed by spraying, a mixture as a spray material including conductive particles, binder resin and a solvent may have a ratio where a solvent has an amount of 80 to 120 when solids including the metal particles and the binder resin have an amount of 100.

Advantageous Effect

According to the electronic component package for electromagnetic interference shielding of the present invention, electromagnetic waves generated from the electronic components mounted in the substrate are absorbed in the magnetic layer and reflected by the conductive layer disposed nearby to prevent the generated electromagnetic waves from being escaped therefrom, thereby protecting adjacent electronic components from being influenced by the electromagnetic waves.

In addition, electromagnetic waves generated from the outside may not only be reflected by the conductive layer, but also be absorbed in the magnetic layer, thereby protecting electronic components disposed in the electronic component package from being influenced by the electromagnetic waves.

The electronic components having superior electromagnetic compatibility (EMC) may be provided by using the electronic component package for electromagnetic interference shielding according to an embodiment of the present invention.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE INVENTION

Figure 1:
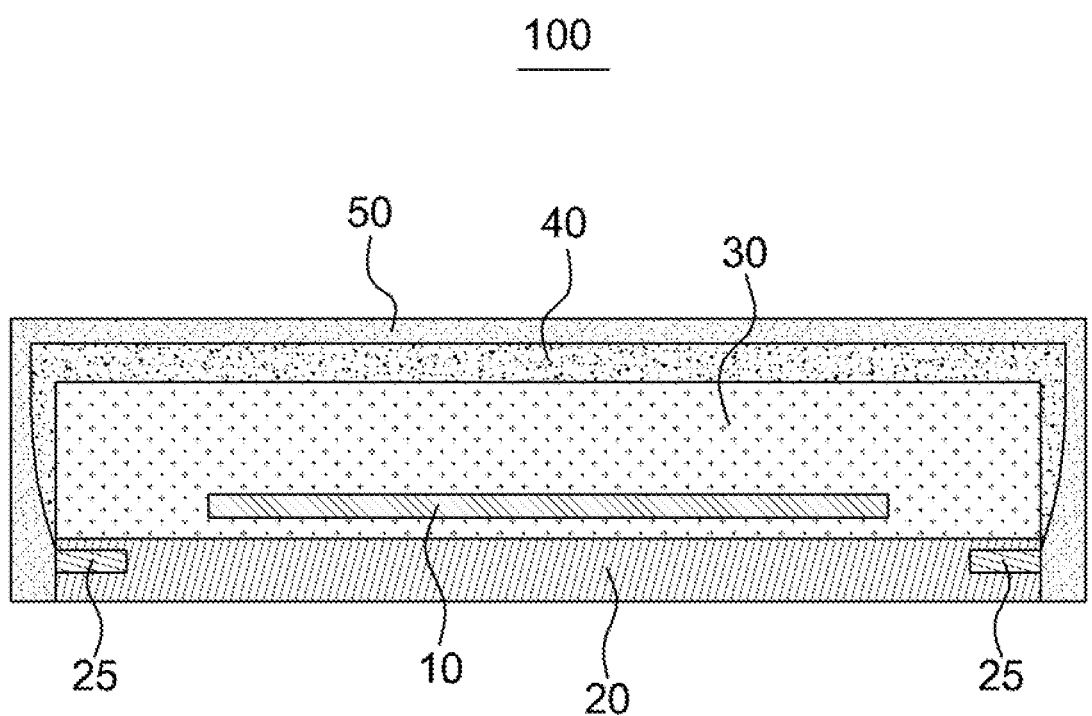
FIG. 1 is a cross-sectional view illustrating an electronic component package for electromagnetic interference shielding according to an embodiment of the present invention.

Advantageous features of the present invention and the method of accomplishing the advantageous features will be apparent with reference to the embodiments which are described below in detail in connection with the accompanying drawings. However, the present invention is not limited to the embodiments and may be embodied in various other forms or examples. These embodiments are provided so that this disclosure will be thorough and complete, and will fully convey the scope of the present invention to those skilled in the art. The scope of the present invention is defined in the appended claims. It should be noted that like reference numerals are given to like components at any parts in the description and the drawings.

Hereinafter, an electronic component package for electromagnetic interference shielding according to a preferred embodiment of the present invention will be described in detail.

Referring to FIG. 1, the electronic component package for electromagnetic interference shielding 100 according to an embodiment of the present invention comprises a substrate 20 in which electronic components 10 are mounted, a molding member 30 formed on the substrate and electronic components, a magnetic layer 40 formed on the molding member, and a conductive layer 50 formed on the magnetic layer.

Any substrates in which the electronic components 10 can be mounted may be used for the substrate 20 and a printed circuit board (PCB) may preferably be used for the substrate 20.

The magnetic layer 40 comprises a first binder resin and magnetic particles, and the magnetic particles may be at least one selected from the group consisting of iron, cobalt, nickel, a nickel alloy, stainless steel, ferrite, and a permalloy.

Epoxy, polyester, urethane, acrylic, silicone, a phenol resin, and an amino resin may be used for the first binder resin, and epoxy may preferably be used for the first binder resin.

The magnetic particles may be configured to be dispersed and embeded within the first binder resin.

The electronic components 10 may include various electronic elements, such as a chip resistor, a chip switch, a diode, a transistor, a filter, a capacitor, an inductor, a multilayer ceramic capacitor, a printed resistor, a thin film condenser, or a flash memory.

The molding member 30 is formed on the electronic components and the substrate where the electronic components are mounted to protect the electronic components. At least one selected from an epoxy molding compound, polyphenylene oxide, epoxy sheet molding, and silicone may be used for the molding member 30.

The magnetic layer 40 is formed on a surface of the molding member 30 to shield electromagnetic waves. The magnetic layer 40 is superior in shielding electromagnetic waves having a low frequency range. The higher frequencies the electromagnetic waves have, the lower shielding efficiency the magnetic layer has. Among others, the magnetic layer 40 contains magnetic particles and as the frequency of electromagnetic waves increases, the permeability of the magnetic particles decreases, thereby resulting in the lower shielding efficiency of the magnetic layer The conductive layer 50 may comprise a second binder resin and conductive particles and the conductive particles may be at least one selected from the group consisting of silver, copper, aluminum and its alloy, and a carbon based material.

Epoxy, polyester, urethane, acrylic, silicone, a phenol resin, and an amino resin may be used for the second binder resin, and the epoxy may preferably be used for the second binder resin.

The same material may be used for both the first binder resin and the second binder resin according to an embodiment of the present invention.

In general, lower resistivity (that is, better conductivity) of the conductive particles or thicker thickness of the conductive layer improves shielding efficiency of the conductive layer.

In other words, silver may preferably be used according to an embodiment of the present invention because it is favorable that metallic particles forming the conductive layer 50 have better conductivity.

The conductive layer 50 shows better efficiency in shielding electromagnetic waves in a high frequency range rather than in a low frequency range. A shielding capacity decreases as the frequencies of the electromagnetic waves decrease.

A portion of the electromagnetic waves arriving at the conductive layer 50 may be reflected on a surface of the conductive layer 50 without reaching the inside of the conductive layer 50, whereas a remaining portion of the electromagnetic waves may penetrate to the inside of the conductive layer.

Figure 2:
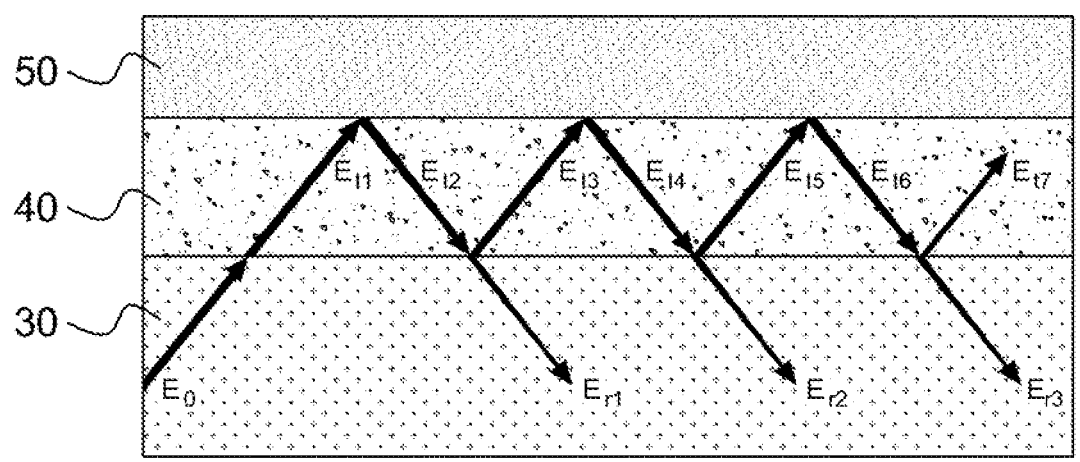
FIG. 2 is a view illustrating a process in which electromagnetic waves generated in electronic components are absorbed and reflected in a magnetic layer and a conductive layer formed in an electronic component package for electromagnetic interference shielding according to an embodiment of the present invention.

FIG. 2 conceptually illustrates a process in which electromagnetic waves disappear inside the electronic component package due to the reflection or absorption without being able to escape therefrom, when the electronic component package for electromagnetic interference shielding adopts the magnetic layer 40 and the conductive layer 50. Specifically, when electromagnetic waves generated in the electronic components mounted in the substrate are emitted, the electromagnetic waves are absorbed by the magnetic layer 40 disposed above the molding member 30 and then reflected by the conductive layer 50 adjacently disposed.

The electronic component package for electromagnetic interference shielding 100 may further include a ground electrode 25 that is formed at a side of the substrate 20 and configured to be embedded therein. The ground electrode has a surface exposed at a side of the substrate and the conductive layer makes contact with the ground electrode The surface of the ground electrode 25 exposed to the outside through a side of the substrate 20 makes contact with the conductive layer 50 for conducting therebetween, and consequently, electromagnetic waves generated from electronic components or coming from the outside may be removed through the ground electrode 25 embedded in a side of the substrate 20 via the conductive layer 50 because the ground electrode 25 is grounded.

The second binder resin has a molecular weight of 1,500 to 15,000 g/mol.

Specifically, during a typical spraying process, a spray gun is disposed above the electronic component package and sprays a material forming the conductive layer toward a lower direction. Here, since the substrate disposed in a lower portion with respect to a total height of the electronic component package is distant from the spray gun, it may happen that the material forming the conductive layer is not adequately sprayed to the ground electrode 25 exposed through a side of the substrate, and thus, the ground electrode may not appropriately contact the formed conductive layer.

As such, the molecular weight of the second binder resin may be adjusted to facilitate forming the contact between the ground electrode and the conductive layer according to an embodiment of the present invention.

When the second binder resin has a molecular weight of less than 1,500 g/mol, a coating composition flows well and the coating composite can coat a lowermost portion of the substrate upon forming the conductive layer on the molding member. In contrast, when the molecular weight of the second binder resin exceeds 15,000 g/mol , the coating composite cannot be formed in the lowermost portion of the substrate because of restricted flowability of the coating composition.

Figure 3:
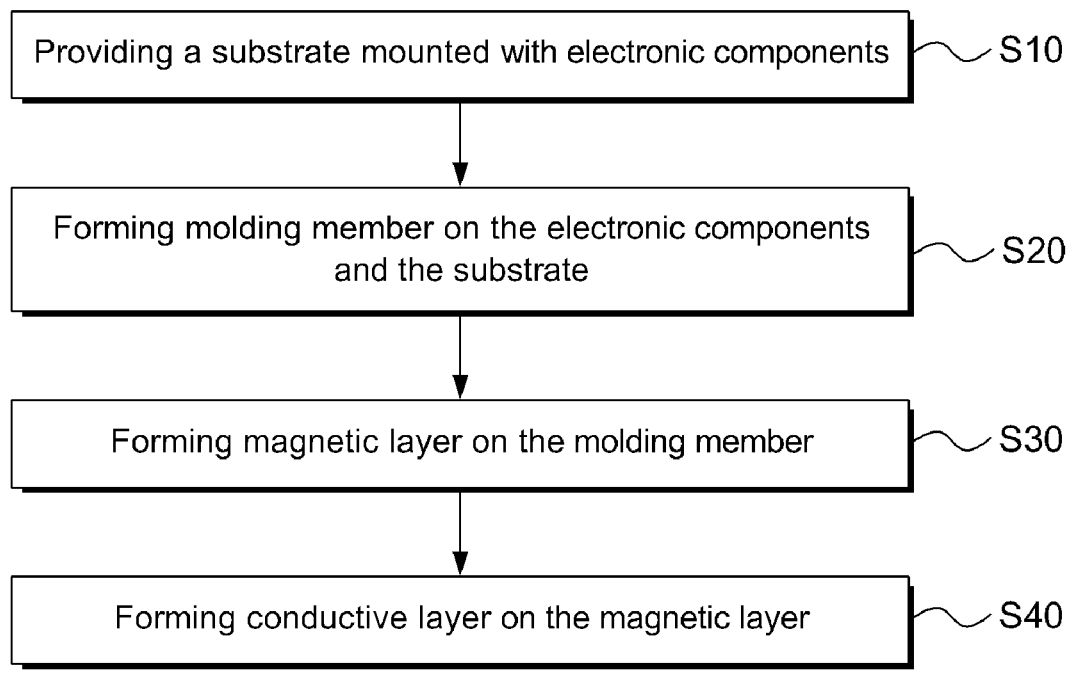
FIG. 3 is a process diagram illustrating a method of manufacturing an electronic component package for electromagnetic interference shielding according to an embodiment of the present invention.

Referring to FIG. 3, a method of manufacturing an electronic component package for electromagnetic interference shielding 100 according to a preferred embodiment of the present invention comprises providing a substrate where the electronic components are mounted (S10), forming a molding member on the electronic components and the substrate (S20), forming a magnetic layer on the modeling member (S30), and forming a conductive layer on the magnetic layer (S40).

The magnetic layer comprises a first binder resin and magnetic particles, which are described above.

The conductive layer comprises a second binder resin and conductive particles, which are described above.

Specifically, the material forming the conductive layer include the conductive particles, the binder resin, an additive, and a solvent. The solvent disappears when the conductive layer hardens.

The binder is responsible for binding the conductive particles that is a filler to a conductive layer. The binder also determines a property of the conductive layer. The filler usually performs functions of electrical conduction and electromagnetic interference shielding.

The conductive layer usually performs its conduction mechanism to shield electromagnetic waves by physical contact of conductive particles, and factors such as a type of the filler, a shape and size distribution, or a content may be able to affect electrical conductivity of the conductive layer.

Since the filler has a wide contact surface, it exhibits a low resistance, and since the flake-like material has a large contact between the particles, it is preferable to use the flake-type silver having excellent conductivity in the present invention.

It is important that the solvent dissolves a binder resin to form the conductive layer having adequate adhesiveness. In this regard, solvents having weak solvency, e.g., alcohol or aliphatic hydrocarbon solvents, and solvents having strong solvency, e.g., an ester, keton, or aromatic hydrocarbon solvents, may preferably be combined in balance.

The magnetic layer and the conductive layer may be formed by using, e.g., sputtering, plating, spray, or a shielding tape.

Here, the magnetic layer and the conductive layer may preferably be formed by spraying.

The magnetic layer and the conductive layer may be formed by spraying because the spray coating method easily adjusts a thickness or viscosity of the conductive layer or a thickness of a side portion thereof, thereby facilitating an electrical current between the conductive layer and the ground electrode formed at a side of the substrate in which electronic components (e.g., semiconductor devices and others) are mounted.

Upon forming the magnetic layer and the conductive layer by spraying, a discharge pressure inside a syringe for spraying may preferably be ranged from 0.5 to 4 psi.

In addition, air may be sprayed to a side portion together with the spraying. The pressure for spraying air may be ranged from 20 to 60 psi.

Air spraying to a side portion thereof may be conducted to add a function of breaking a liquid droplet discharged from a syringe into smaller pieces.

In addition, a spray head speed for spraying may be ranged from 200 to 400 mm/s.

An internal diameter of a spray head nozzle may be maintained between 250 and 450 μm and upon spraying, a diameter of a circle formed on the substrate may be controlled to be 10 to 30 mm and a height of the head is preferably between 80 and 100 mm.

Upon forming the conductive layer by spraying, a mixture of metal powder, binder resin and a solvent for spraying may have a ratio where a solvent has an amount of 80 to 120 when solids including the metal power and the binder resin have an amount of 100.

Here, when the amount of the solvent is less than 80, a viscosity of the mixture solution is increased, leading to reduced flowability, and it is difficult to obtain a uniform coating layer upon spraying to form a layer. In contrast, when the amount of solvent exceeds 120, the viscosity of the solution is substantially decreased and a fillet is formed due to the solution formed on a bottom portion of the substrate where electronic components are mounted, thereby causing a burr.

The magnetic layer and the conductive layer are formed together in the electronic component package where electronic components are mounted according to an embodiment of the present invention. Specifically, the conductive layer reflecting electromagnetic waves instead of removing is combined with the magnetic layer adsorbing electromagnetic waves, thus accomplishing the electromagnetic interference shielding more effectively.

In addition, the double layer formed to shield electromagnetic waves is also associated with generated frequencies. For example, reflective efficiency of conductive shielding (e.g., the conductive layer) is superior for high frequency of 1 MHz or higher, but absorptive efficiency by magnetic shielding (e.g., the magnetic layer) becomes dominant for low frequency of 1 MHz or lower.

Accordingly, the electronic component package having a double layer structure of the magnetic layer and the conductive layer can achieve electromagnetic interference shielding in a wider range of frequencies.

The above descriptions are provided for illustrative purposes of the technical concepts of the present invention, and a person having ordinary skill in the art may understand that various other modifications or equivalents are possible without departing from the natural characteristics of the present invention. Accordingly, the technical scope of the present invention should be construed broadly within the technical spirit as defined in the appended claims.

What is claimed is:

1. A method of manufacturing an electronic component package for electromagnetic interference shielding, the method comprising:
    providing a substrate where electronic components and a ground electrode are mounted, wherein the ground electrode is exposed through a lateral side surface of the substrate;
    forming a molding member on the electronic components and the substrate;
    forming a magnetic layer on the molding member; and
    forming a conductive layer on the magnetic layer and the lateral side surface of the substrate with a spraying process,
    wherein the conductive layer comprises a second binder resin and conductive particles mixed with the second binder resin and
    wherein the second binder resin has a molecular weight of 1,500 to 15,000 g/mol to secure contact between the ground electrode and the conductive layer during forming the conductive layer with the spraying process.

2. The method of claim 1, wherein the magnetic layer comprises a first binder resin and magnetic particles.

3. The method of claim 1, wherein the forming of the magnetic layer is performed by sputtering.

4. The method of claim 1, wherein the forming of the magnetic layer is performed by spraying.

5. The method of claim 4, wherein a mixture as a spray material including conductive particles, binder resin and a solvent has a ratio where a solvent has an amount of 80 to 120 when solids including the conductive particles and the binder resin have an amount of 100.

* * * * *